United States Patent
Schiek et al.

(10) Patent No.: US 11,742,823 B2
(45) Date of Patent: Aug. 29, 2023

(54) BAW RESONATOR WITH IMPROVED POWER DURABILITY AND HEAT RESISTANCE AND RF FILTER COMPRISING A BAW RESONATOR

(71) Applicant: RF360 EUROPE GMBH, Munich (DE)

(72) Inventors: Maximilian Schiek, Puchheim (DE); Roland Rosezin, Bernau am Chiemsee (DE); Willi Aigner, Moosinning (DE); Thomas Mittermaier, Schwindegg (DE); Edgar Schmidhammer, Stein an der Traun (DE); Stephane Chamaly, Mouans-Sartoux (FR); Xavier Perois, Mouans-Sartoux (FR); Christian Huck, Munich (DE); Alexandre Augusto Shirakawa, San Diego, CA (US)

(73) Assignee: RF360 Singapore, San Diego, CA (US)

( * ) Notice: Subject to any disclaimer, the term of this patent is extended or adjusted under 35 U.S.C. 154(b) by 75 days.

(21) Appl. No.: 17/046,127

(22) PCT Filed: Mar. 5, 2019

(86) PCT No.: PCT/EP2019/055439
§ 371 (c)(1),
(2) Date: Oct. 8, 2020

(87) PCT Pub. No.: WO2019/197081
PCT Pub. Date: Oct. 17, 2019

(65) Prior Publication Data
US 2021/0036684 A1  Feb. 4, 2021

(30) Foreign Application Priority Data
Apr. 11, 2018 (DE) .................... 10 2018 108 608.3

(51) Int. Cl.
*H03H 9/02* (2006.01)
*H03H 9/13* (2006.01)
(Continued)

(52) U.S. Cl.
CPC .... *H03H 9/02102* (2013.01); *H03H 9/02015* (2013.01); *H03H 9/131* (2013.01); *H03H 9/175* (2013.01); *H03H 9/54* (2013.01)

(58) Field of Classification Search
CPC .............. H03H 9/175; H03H 9/02015; H03H 9/02102; H03H 9/131; H03H 9/54; H03H 9/02149; H03H 9/542
(Continued)

(56) References Cited

U.S. PATENT DOCUMENTS 2,660,680 A    11/1953   Koerner
9,602,076 B1 *  3/2017   Kreuzer ............. H03H 9/02086
(Continued)

FOREIGN PATENT DOCUMENTS

JP    H06 244002 A    9/1994
JP    2000 031783 A   1/2000
JP    2005 278121 A   10/2005

OTHER PUBLICATIONS

Machine English Translation of JP2005278121A Published on Oct. 6, 2005 (Year: 2005).*
(Continued)

*Primary Examiner* — Rakesh B Patel
*Assistant Examiner* — Jorge L Salazar, Jr.
(74) *Attorney, Agent, or Firm* — Patterson + Sheridan LLP (57) ABSTRACT

A BAW resonator (BAWR) with improved power durability and improved heat resistance is provided. The resonator comprises a layer stack with a piezoelectric material (PM) between a bottom electrode (EL1) and a top electrode (EL2)
(Continued)

and a shunt path parallel (PCPP) to the layer stack provided to enable an RF signal to bypass the layer stack, e.g. to ground (GND). The shunt path (PCPP) has a temperature dependent conductance with a negative temperature coefficient, NTC, of resistance. When the temperature of the device rises due to high power operation, currents that would otherwise permanently damage the device are shunted to ground or another dedicated terminal by the temperature dependent shunt path. Upon cooling down normal operation is resumed.

20 Claims, 8 Drawing Sheets

(51) Int. Cl.
*H03H 9/17* (2006.01)
*H03H 9/54* (2006.01)

(58) Field of Classification Search
USPC .......................................... 333/133, 187, 188
See application file for complete search history.

(56) References Cited

U.S. PATENT DOCUMENTS

| | | | |
|---|---|---|---|
| 2005/0110597 A1* | 5/2005 | Larson | H03H 9/605 |
| | | | 333/191 |
| 2007/0096851 A1 | 5/2007 | Uno et al. | |
| 2013/0335169 A1* | 12/2013 | Godshalk | H03H 9/175 |
| | | | 333/187 |
| 2016/0079956 A1* | 3/2016 | Son | H03H 3/04 |
| | | | 29/25.35 |

OTHER PUBLICATIONS

International Search Report and Written Opinion dated Jun. 24, 2019 corresponding to Application No. PCT/EP2019/055439.

* cited by examiner

Fig. 17

BAW RESONATOR WITH IMPROVED POWER DURABILITY AND HEAT RESISTANCE AND RF FILTER COMPRISING A BAW RESONATOR

CROSS-REFERENCE TO RELATED APPLICATIONS

This application is a national stage application under 35 U.S.C. 371 of PCT/EP2019/055439, filed Mar. 5, 2019, which claims the benefit of German Application No. 10 2018 108 608.3, filed Apr. 11, 2018, both of which are incorporated herein by reference in their entireties.

The present invention refers to a BAW resonator, e.g. for RF filters in mobile communication devices, having an improved power durability and an improved heat resistance. Further, the invention refers to RF filters.

In mobile communication devices RF filters are utilized to distinguish between wanted RF signals and unwanted RF signals. For example, a transmission filter between a power amplifier and an antenna port is used to let only transmission signals propagate to an antenna port. In a reception signal path a reception signal is utilized to pass reception signals and in particular to isolate the reception port for transmission signals.

RF filters comprise resonators that may work with acoustic waves, such as bulk acoustic waves. A BAW resonator (BAW=bulk acoustic wave) comprises a sandwich construction with a bottom electrode and a top electrode. Between the bottom electrode and the top electrode piezoelectric material in a piezoelectric layer is arranged. If the thickness of the piezoelectric layer is chosen to match a working frequency of an RF signal, then the resonator converts between RF signals and acoustic waves.

Thus, resonators of RF filters are exposed to RF power. Ohmic losses in the electrodes or other energy dissipation effects lead to an energy conversion from RF energy to heat. Correspondingly, heated resonators suffer a shift of characteristic frequencies such as resonance frequency or anti-resonance frequency due to expansion of the piezoelectric layer and a change of material properties, e.g. elastic stiffness with elevated temperature. Further, if the resonator is, for example, part of a bandpass filter configuration then the passband is shifted in frequency and the corresponding self-heating of the resonator gives rise to additional losses. If the temperature increase exceeds a certain critical value then it is possible for permanent damage to occur, resulting in a permanent failure of corresponding filter components.

The above-mentioned risk is further increased by the trend towards miniaturization resulting in a higher circuit density.

Thus, what is needed is a BAW resonator having an improved power durability and an improved heat resistance.

To that end, the BAW resonator and the corresponding RF filter according to the independent claims are provided. Dependent claims provide preferred embodiments.

The BAW resonator comprises a layer stack with a bottom electrode, a top electrode and a piezoelectric material between the bottom electrode and the top electrode. Further, the BAW resonator comprises a shunt path parallel to the layer stack provided to enable an RF signal to bypass the layer stack. The shunt path has a temperature dependent conductance.

Thus, the shunt path realizes a parallel conductance protection path via which RF power can be bypassed to protect the integrity of the layer stack.

As a result, the power durability is increased, the heat resistance is enhanced and the risk of permanent damage, e.g. due to electrode delamination, is significantly reduced.

It is possible to use the shunt path to conduct unwanted RF power to a special port or to a special electric potential. Correspondingly, it is possible to bypass the unwanted RF power to ground potential.

The temperature dependence of the conductance of the shunt path has the advantage that an automatic protection system is obtained without the need for additional controlling means for controlling the temperature and/or activating shunt path switches.

It is preferred that the conductance of the shunt path is increased with increasing temperatures. Thus, especially when a certain critical temperature is reached, the conductance of the shunt path can be so small compared to the conductance of the conventional signal path within the filter circuit that an excess of RF power propagates via the shunt path. This results in an increased insertion loss as visible in the forward transmission direction, e.g. for the matrix element $S_{21}$.

When seen from a user perspective, e.g. of a mobile communication device, then the device is self-protected. In the worst case a battery may be drained faster or a call may be dropped. But as soon as normal operation is resumed as the temperature is reduced to a normal operating temperature, the specified filter performance is restored and no permanent damage is obtained.

The conductivity of the shunt path can be tailored in such a way that a specified performance is given without a limitation to a specified power and a specified temperature range.

It is possible that a critical temperature is determined by the selection of the material of the substrate.

It is possible that the BAW resonator comprises an acoustic mirror below the bottom electrode. The acoustic mirror has a temperature dependent conductance and establishes an element of the shunt path.

Electroacoustic resonators working with bulk acoustic waves can be realized as SMR-type resonators (SMR=solidly mounted resonator). Such a resonator has the sandwich construction with the bottom electrode, the piezoelectric layer and the top electrode arranged on an acoustic mirror. The acoustic mirror may be arranged on a carrier substrate. The acoustic mirror is utilized to mechanically connect the sandwich construction to the carrier substrate while simultaneously acoustically decoupling the sandwich construction from the carrier substrate. Thus, the acoustic mirror confines acoustic energy to the sandwich construction and prevents acoustic energy from dissipating in the carrier substrate. To that end, the acoustic mirror comprises two or more layers arranged above one another. The layers have different acoustic impedances. In particular, one layer of a low acoustic impedance is arranged on a layer of high acoustic impedance. The acoustic impedance of the material is increased with increasing density and increasing stiffness. Correspondingly, a low acoustic impedance is obtained when the corresponding layer comprises a material of a low density and low mechanical stiffness parameters (Young's modulus).

Generally, for the layers of high acoustic impedance metals with a high density, e.g. tungsten, gold, etc. are preferred. Such layers usually have a high conductance. Correspondingly, for the layers of low acoustic impedance usually dielectric materials such as a silicon oxide, e.g. a silicon dioxide, can be used. However, dielectric materials are not well suited to establish a shunt path for an excess of RF power. Correspondingly, it is preferred to use materials having a temperature dependent conductance as materials for the layers of low acoustic impedance.

Material combinations for the mirror could comprise tungsten as a material with a high acoustic impedance and a silicon oxide, e.g. $SiO_2$, or Mg as a material with a low acoustic impedance.

It is possible that the layers of low acoustic impedance comprise silicon. Silicon is a material that intrinsically has a temperature dependent conductance. Further, methods to specifically tailor the temperature dependence of the conductance of silicon are well-known, e.g. by doping, such that a suited conductance is obtained for the acoustic mirror to be the protection element of the shunt path.

Additionally, or as an alternative thereto, it is possible to arrange the BAW resonator on a carrier substrate. The carrier substrate has a temperature dependent conductance and establishes an element of the shunt path.

BAW resonators generally are arranged on a carrier substrate. Thus, selecting a material for the carrier substrate such that the corresponding temperature dependent conductance is obtained is a measure that maintains a simple filter construction while providing the possibility to self-protect the BAW resonator.

It is possible that the sandwich construction is in direct contact with the carrier substrate. However, it is also possible that the sandwich construction and the carrier substrate are separated, e.g. by an acoustic mirror.

In the latter case it is possible to electrically connect one section of the carrier substrate with the bottom electrode and another section of the carrier substrate with the top electrode of the BAW resonator. Then, the corresponding path between the two contacts of the carrier substrate establish a shunt connection parallel to the piezoelectric layer. Depending on the temperature of this shunt path RF power applied to the two electrodes can propagate via the carrier substrate.

To protect the resonator, in principle any shunt path for electric power is possible. However, a random conductance of the power may lead to unwanted reflection effects and too much power could be conducted to another place where the corresponding component may be harmed.

Thus, it is possible that power, e.g. power of a transmission signal, is conducted directly to a ground potential.

Thus, it is possible that the shunt path directly leads to a ground potential.

This avoids that power is reflected to the power amplifier and that excess power hits a low noise power amplifier in the case of a resonator in a duplexer.

To that end it is possible the shunt path comprises a section of a doping level different from its surrounding.

The BAW resonator can be a part of an RF filter. Correspondingly, the RF filter can be protected in a self-protecting manner by the shunt path.

With respect to an RF filter it is possible to shunt only a single resonator. However, it is also possible to design the way of the shunt path such that two or more resonators are shunted and protected.

As an alternative or additionally it is possible that the BAW resonator comprises a protection element. The protection element has a temperature dependent conductance and establishes an element of the shunt path.

In addition to the possibilities of utilizing a section of the carrier substrate or of an acoustic mirror it is possible to provide a dedicated protection element that has the specific temperature dependent conductance on or above the surface of the carrier substrate or embedded within the carrier substrate. The protection element is electrically connected in a shunt path and has the corresponding material that provides the temperature dependent conductance functionality. For dedicated protection elements conventional materials, e.g. for the acoustic mirror or for the carrier substrate, can be utilized. Changes in design of the corresponding filter topology and the corresponding filter component are reduced to a minimum.

Then, the protection element can comprise a piece of silicon, e.g. of doped silicon.

As previously described it is possible that silicon can be used as a part of the shunt path parallel to the layer stack. Correspondingly, it is possible that the BAW resonator is arranged on a carrier substrate comprising silicon.

It is possible that the silicon is doped silicon.

Dopants can be chosen according to their effect on the conductance of the carrier substrate, in particular on their effect on the temperature dependence of the conductance.

It is possible that the silicon has a conductivity below $10^{-3}$ $1/\Omega$ cm at temperatures below 100° C. and a conductivity above $10^{-3}$ $1/\Omega$ cm at temperatures above 200° C.

It is possible that the BAW resonator has a silicon oxide layer. The silicon oxide layer can be arranged between the bottom electrode and a carrier substrate.

It is possible that the silicon oxide has a thickness between 100 nm and 600 nm.

The silicon, e.g. of the carrier substrate and/or of an additional layer, can be a polycrystalline silicon.

Correspondingly, an RF filter can comprise a BAW resonator as described above.

Further, the RF filter can comprise two or more resonators. The RF filter can have the resonators in a ladder-type like topology comprising two or more series resonators arranged in a series in a single path. Two or more parallel resonators in corresponding parallel paths shunt the signal path to ground.

Thus, a resonator is provided where produced heat leads via the increase in conductance to the resonator's protection instead of its destruction.

The working principles of the BAW resonator and of the corresponding RF filter and details of preferred embodiments are shown in the schematic accompanying figures.

Figure 1:
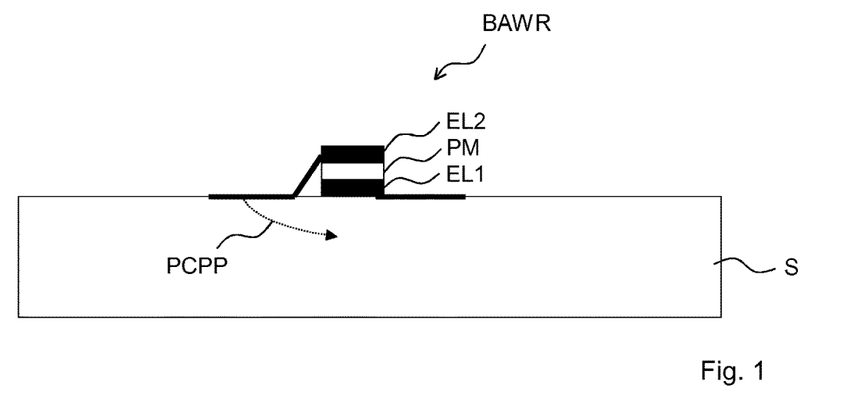
FIG. 1 shows a basic embodiment of a BAW resonator.

FIG. 1 shows a basic embodiment of a BAW resonator BAWR on a carrier substrate S. The BAW resonator comprises a bottom electrode EL1, a top electrode EL2 and a piezoelectric layer with a piezoelectric material PM sandwiched between the bottom electrode and the top electrode. The sandwich construction is arranged on the carrier substrate S. The environment of the resonator BAWR and in particular the environment's temperature dependence of conductance is chosen such that a parallel conductance protection path PCPP is obtained that can shunt unwanted RF power bypassing the layer stack.

Figure 2:
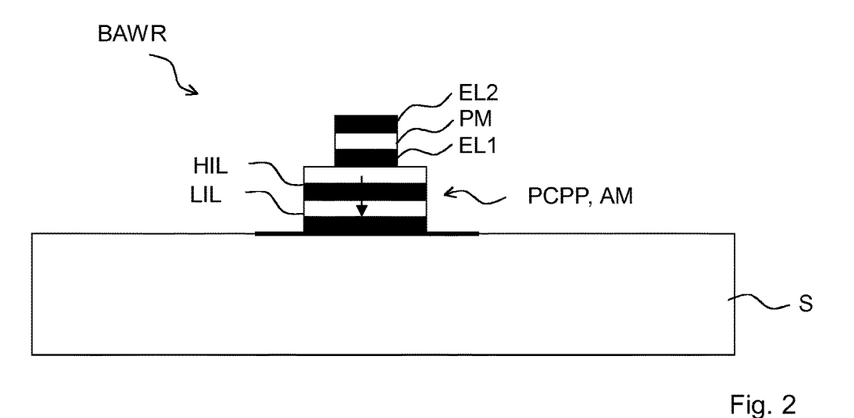
FIG. 2 shows the possibility of utilizing an acoustic mirror.

FIG. 2 illustrates the possibility of utilizing an acoustic mirror between the sandwich construction and the carrier substrate S. In particular, the acoustic mirror AM comprises a plurality of layers with a low acoustic impedance LIL and layers of a high acoustic impedance HIL stacked iteratively one above the other. Generally, the materials with the high acoustic impedance HIL comprise a metal that has a high conductance. The material of the layer of the low acoustic impedance LIL is chosen—at least along the parallel conductance protection path PCPP indicated by the arrow—such that the corresponding protection function is obtained.

Figure 3:
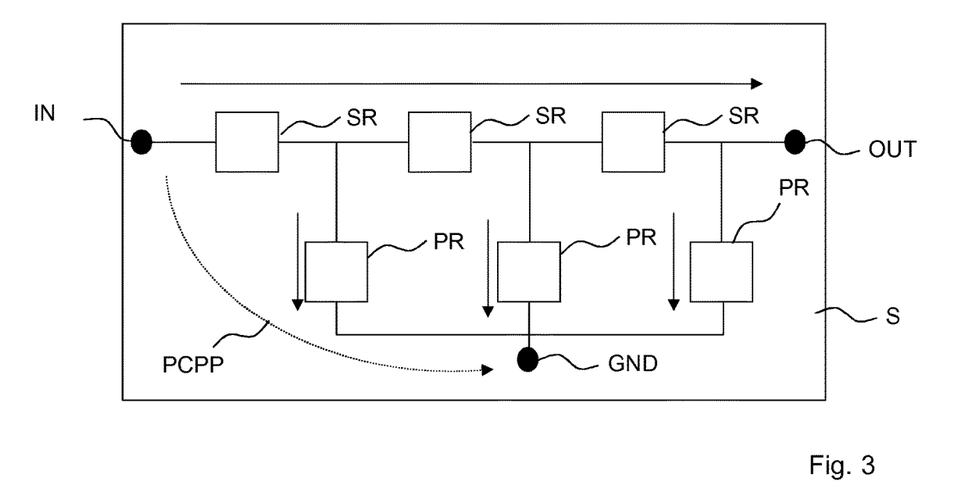
FIG. 3 illustrates the application within a ladder-type like topology.

FIG. 3 illustrates a top view onto a plurality of resonators, SR, PR arranged on the carrier substrate S. Series resonators SR are electrically connected in series in the signal path between an input port IN and an output port OUT. Parallel resonators PR in corresponding parallel paths electrically connect the signal path to ground GND. At least one resonator, e.g. a series resonator SR or a parallel resonator PR or a plurality of resonators are shunted at corresponding temperatures via the parallel conductance protection path PCPP. It is possible that the parallel conductance protection path directly conducts an excess of RF power from the input port IN to ground GND. This is possible, e.g., by arranging the signal lines in contact with the carrier substrate S such that the corresponding temperature dependent conductance is obtained.

Figure 4:
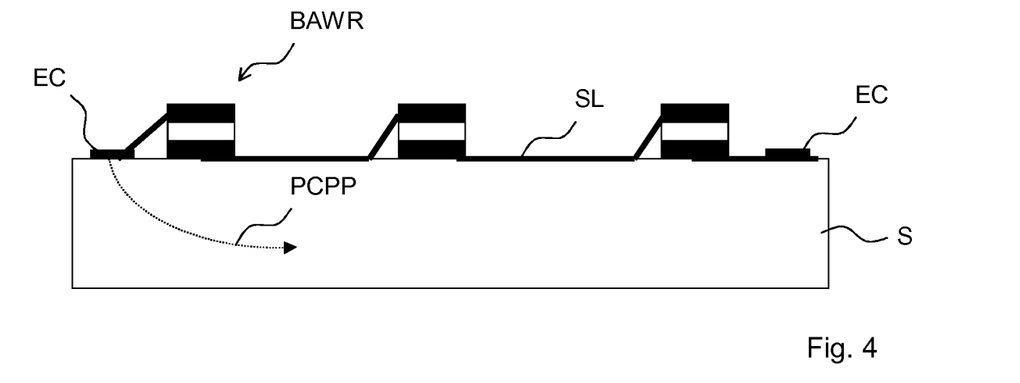
FIG. 4 illustrates the connection of series resonators in the signal path.

FIG. 4 shows the possibility of arranging a plurality of BAW resonators BAWR, e.g. series resonators as shown in FIG. 3, on the carrier substrate S such that the carrier substrate S is at least in direct contact with one segment of the signal path, e.g. an external contact EC at one section and at another section. Thus, via the parallel conductance protection path PCPP an excess of RF power can be directly conducted between the external connections EC.

Figure 5:
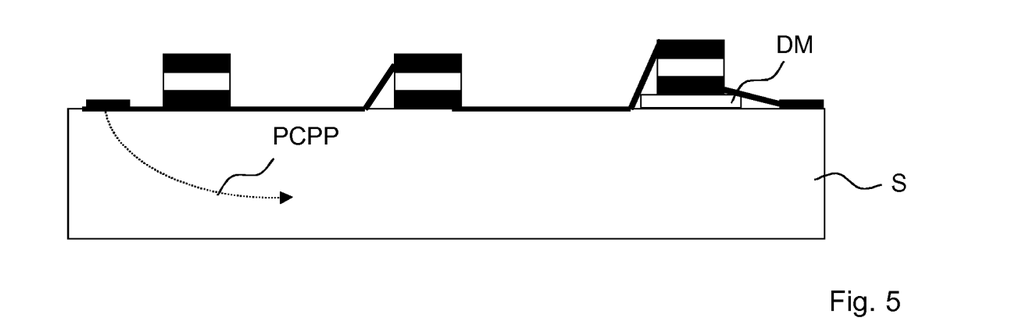
FIG. 5 illustrates the use of a dielectric material.

FIG. 5 illustrates the possibility of the use of a dielectric material DM. A dielectric material DM that has a temperature independent and low conductance can be used to electrically isolate one or a plurality of resonators from a direct contact to the parallel conductance protection path PCPP.

Figure 6:
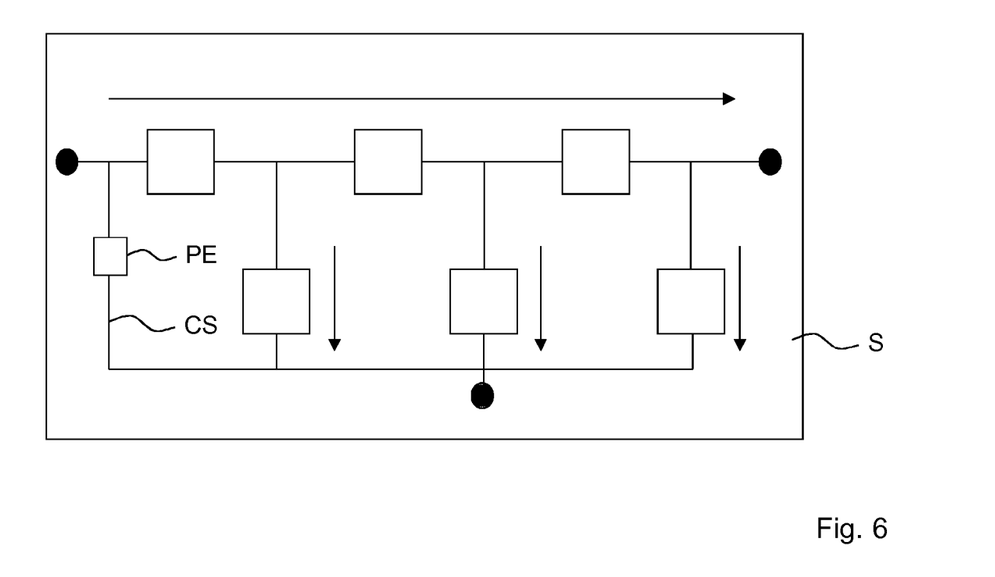
FIG. 6 illustrates the use of a protection element.

FIG. 6 shows the possibility of using a dedicated protection element PE arranged at a specific position on a carrier substrate S together with signal lines electrically connecting the protection element PE to the signal path and to a ground potential, e.g. via a conducting structure CS.

The protection element PE has a material chosen such that the wanted temperature dependent conductance is obtained. To that end, the protection element can have a piece of doped silicon, for example. Other materials such as gallium arsenide (GaAs) are also possible.

The arrows in FIG. 6 indicate the direction of wanted RF signals parallel to the signal path and the direction of unwanted RF signals parallel to the shunt path where the filter functionality ensures that unwanted signals are not provided at the output of the filter.

Figure 7:
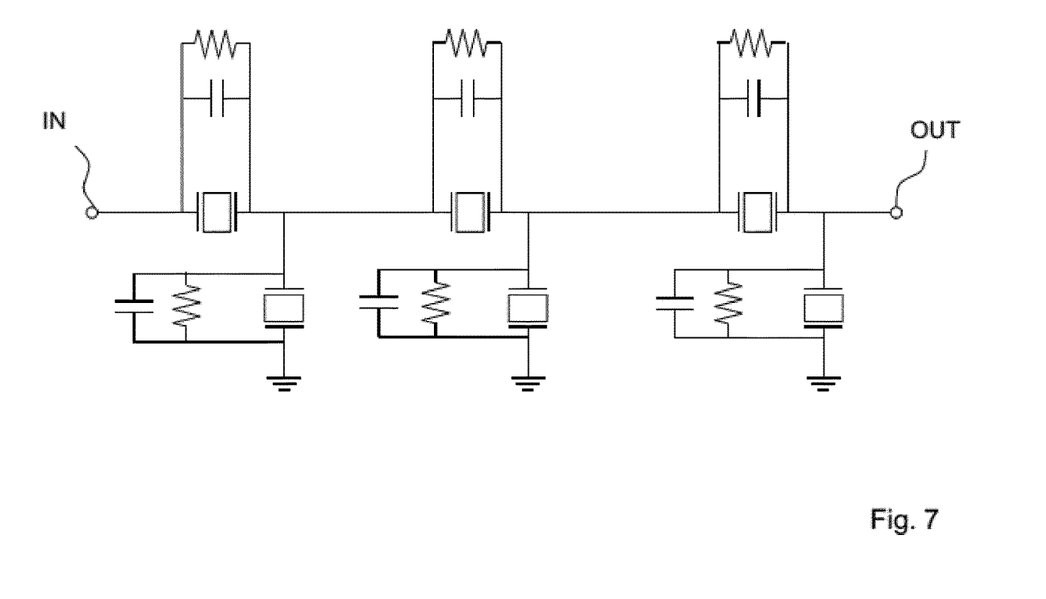
FIG. 7 illustrates an equivalent circuit diagram of a ladder-type like topology used to illustrate different effects.

FIG. 7 shows an equivalent circuit diagram of a ladder-type like topology comprising three series resonators and three shunt resonators in corresponding shunt paths. Parallel to each resonator is a parallel connection of a resistance element and a capacitance element. The equivalent circuit diagram shown in FIG. 7 is utilized to determine preferred material values to determine the temperature dependent conductance of the parallel conductance protection path.

Figure 8:
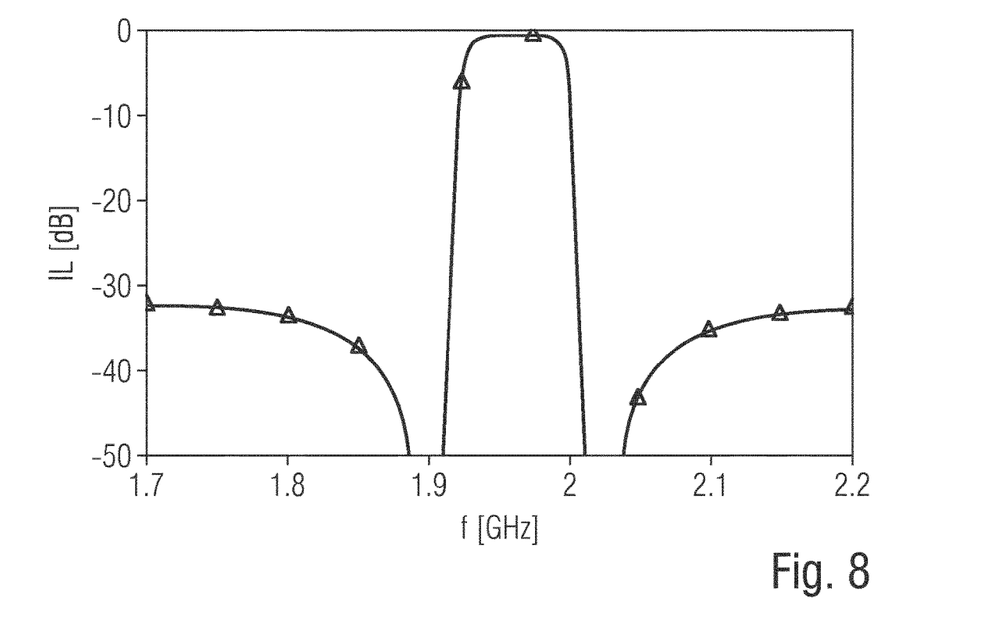
FIG. 8 shows the forward transmission of a corresponding RF filter at a usual temperature.

FIG. 8 illustrates the insertion loss of the topology of FIG. 7 of normal operating parameters. It can be seen that in a passband having 1.96 GHz as a center frequency, the insertion loss is very low.

Figure 9:
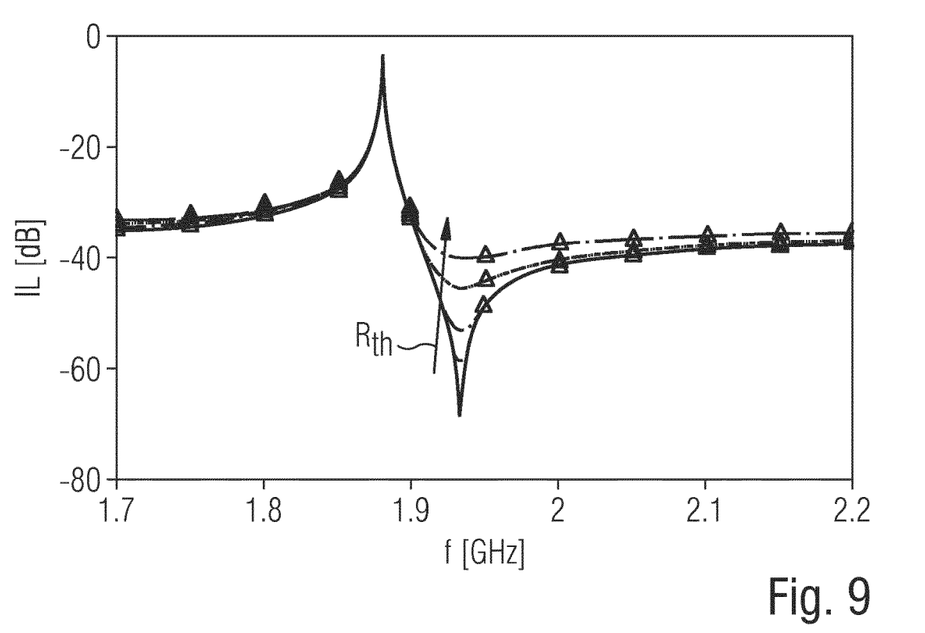
FIGS. 9 and 10 show the influence of a parallel RC element as a thermal loss component on a single series resonator.

FIG. 9 illustrates the response of a single resonator to varying temperatures of the parallel conductance protection path. For example FIG. 9 illustrates a decrease of insertion loss at the anti-resonance frequency for decreasing temperatures. With decreasing temperatures the temperature dependent resistance R decreases, this degrades the quality factor at the anti-resonance frequency.

Figure 10:
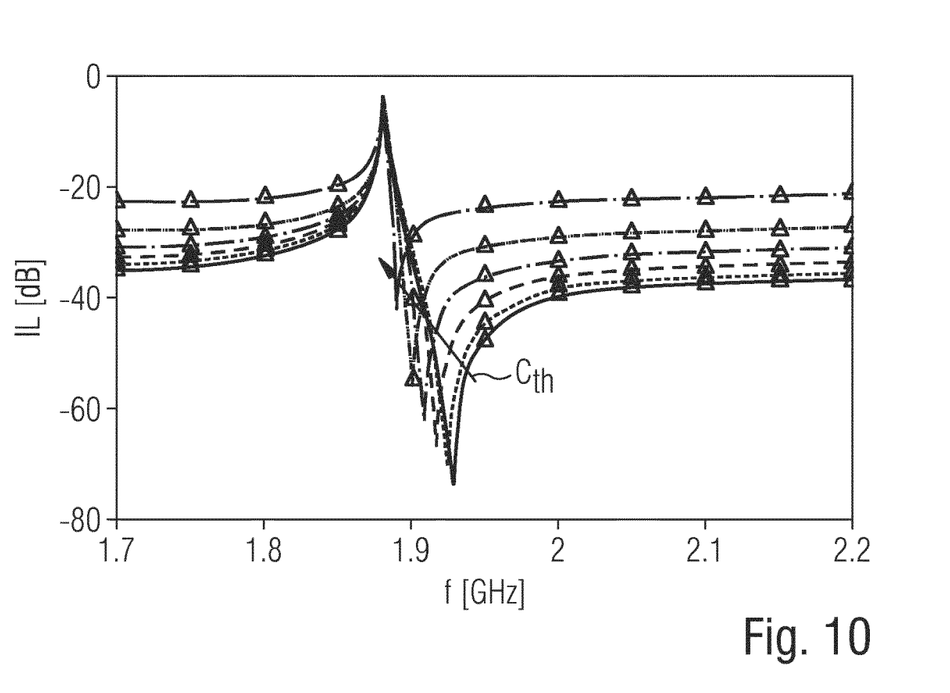

Similarly to FIG. 9 FIG. 10 illustrates a degradation of the coupling factor when the capacitance parallel to the resonator as shown in the equivalent circuit diagram of FIG. 8 increases with temperature and causes a frequency shift.

Figure 11:
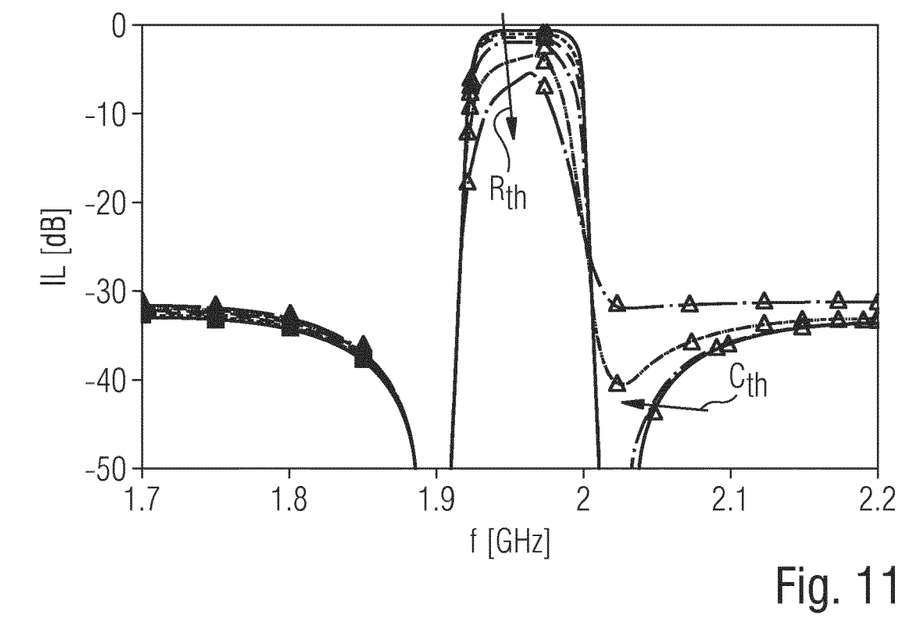
FIGS. 11 to 17 show insertion losses for different resistance and capacitance values.
Figure 12:
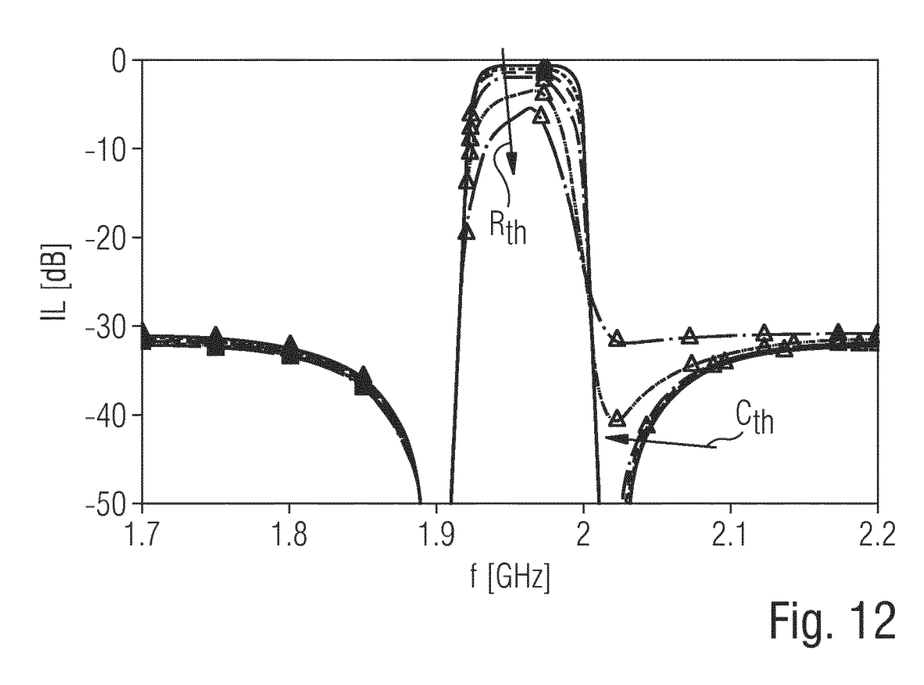
Figure 13:
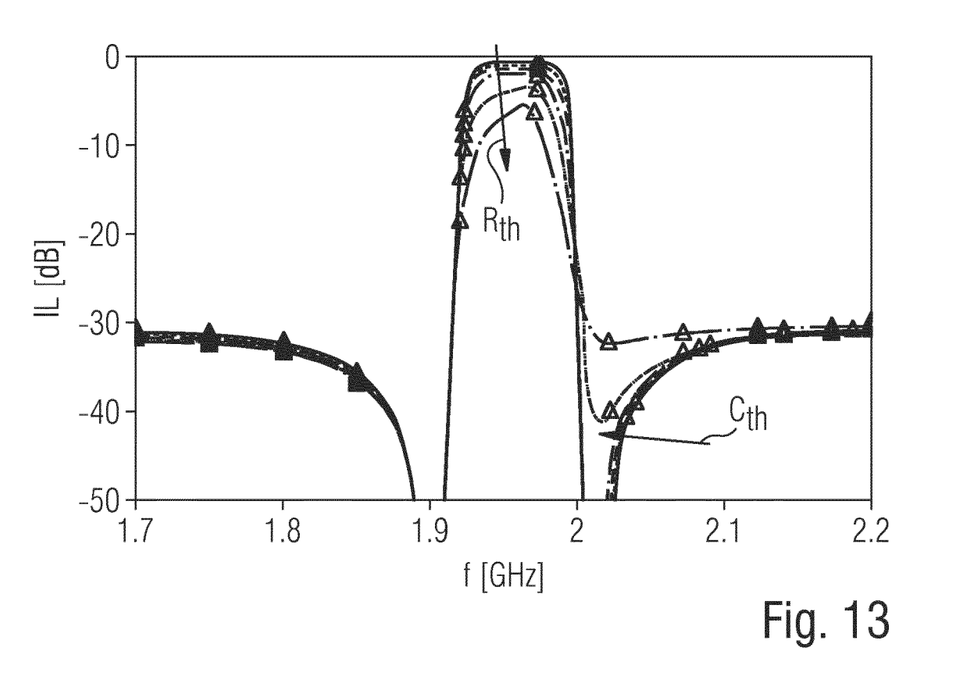
Figure 14:
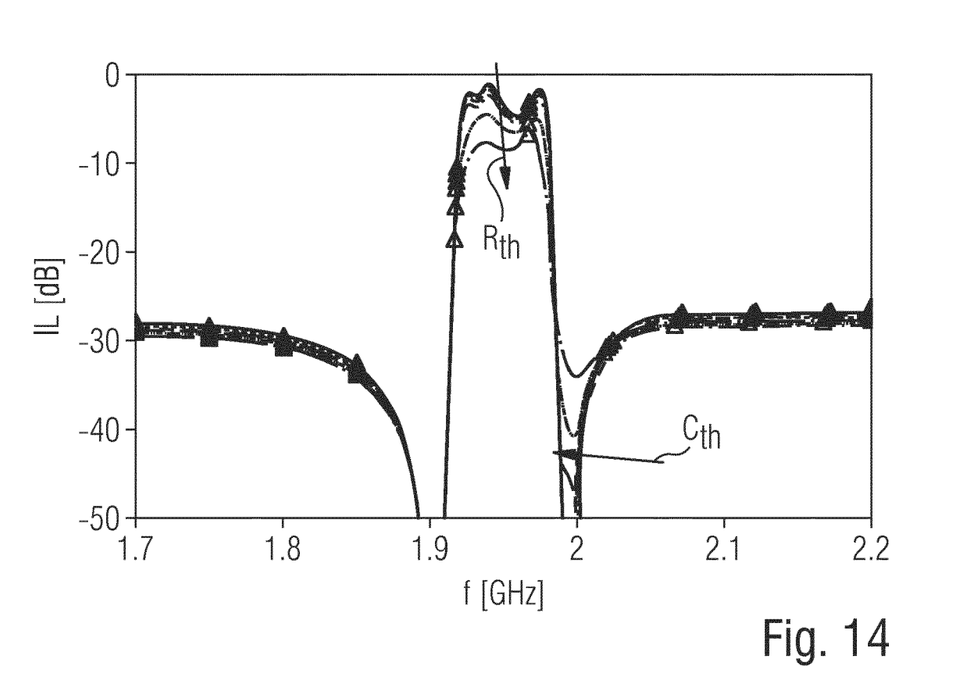
Figure 15:
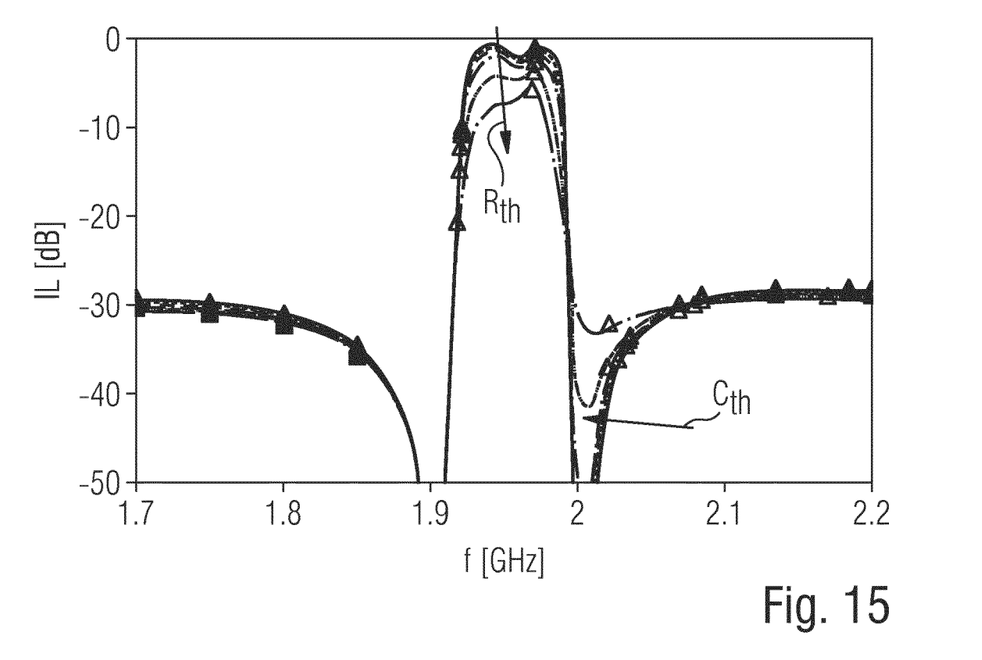
Figure 16:
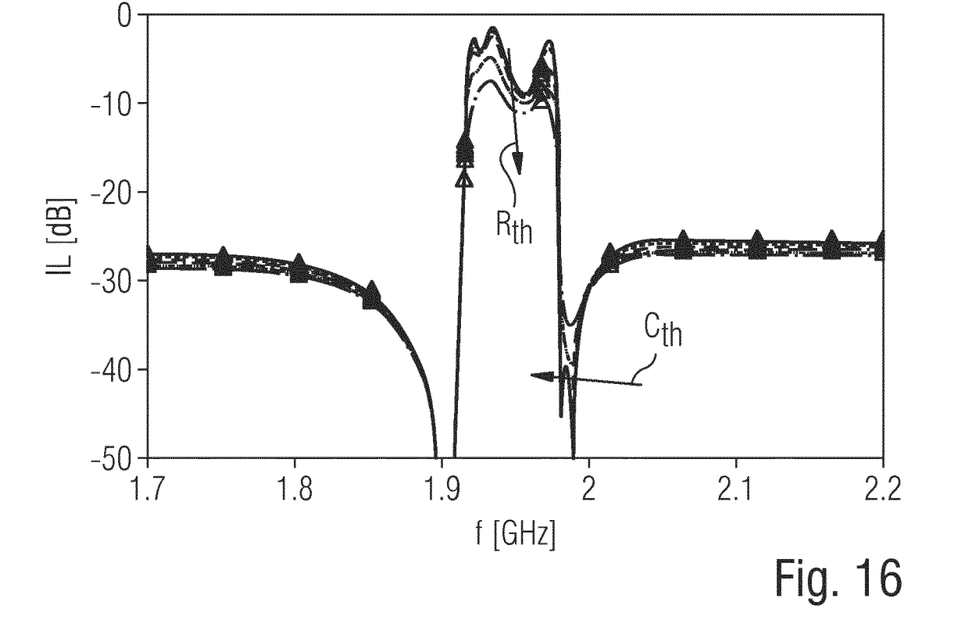

FIG. 11 shows an increase in insertion loss with increased temperatures. The different curves in FIG. 11 correspond to simulated resistance values of the parallel conductance protection path (5000 ohms, 2000 ohms, 1000 ohms, 500 ohms, 200 ohms, 100 ohms).

Figure 17:
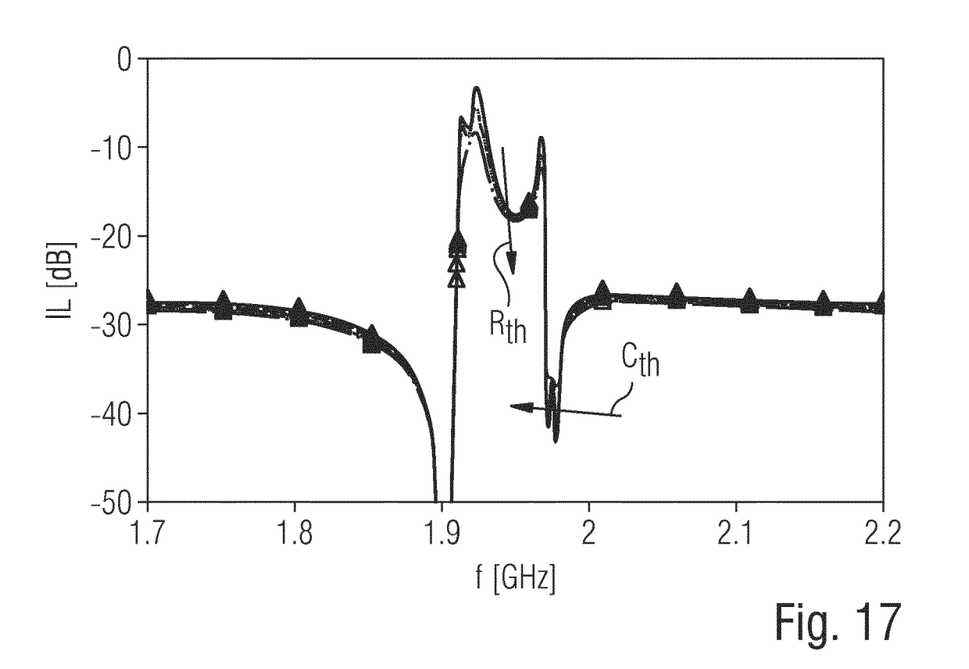

Similarly, FIGS. 12 to 17 show an increase in insertion loss with a decrease in resistance (5000 ohms, 2000 ohms, 1000 ohms, 500 ohms, 200 ohms, 100 ohms) while the capacity of the parallel capacitance element of the protected resonator is increased from 0 picofarad (FIG. 11) to 0.1 pF (FIG. 12), 0.2 pF (FIG. 13), 0.5 pF (FIG. 14), 1 pF (FIG. 15), 2 pF (FIG. 16) and finally 5 pF (FIG. 17).

Thus, a self-protection system for BAW resonators and filters employing BAW resonators that does not need additional control circuitry is provided.

The BAW resonator and the RF filter are not limited to the details and embodiments described above and shown in the figures. Resonators can comprise further layers and structures, e.g. for establishing preferred acoustic modes.

RF filters can comprise further resonating or non-resonating circuit elements.

In particular, conventional means to improve power durability and heat resistance, such as cascading resonators, are also possible.

LIST OF REFERENCE SIGNS

AM: acoustic mirror
BAWR: BAW resonator
CS: conducting structure
EC: external contact
EL1: bottom electrode
EL2: top electrode
f: frequency
GND: ground
HIL: layer of a high acoustic impedance
IL: insertion loss
IN: input port
LIL: layer of a low acoustic impedance
OUT: output port
PCPP: parallel conductance protection path
PE: protection element
PM: piezoelectric material
PR: parallel resonator
S: carrier substrate
SL: signal line
SR: series resonator

The invention claimed is:
1. A bulk acoustic wave (BAW) resonator, comprising:
a layer stack with a bottom electrode, a top electrode and
a piezoelectric material between the bottom electrode and the top electrode; and a shunt path, parallel to the layer stack, connecting a ground potential to at least one of the top electrode or the bottom electrode, wherein the shunt path has a temperature dependent conductance configured to enable a radio frequency (RF) signal to bypass the layer stack or permit the RF signal to be input into the layer stack depending on a temperature of the shunt path.

2. The BAW resonator of claim 1, further comprising an acoustic mirror below the bottom electrode, wherein the acoustic mirror establishes an element of the shunt path.

3. The BAW resonator of claim 1, wherein:
the BAW resonator is arranged on a carrier substrate, and the carrier substrate establishes an element of the shunt path.

4. The BAW resonator of claim 1, further comprising a protection element, wherein the protection element establishes an element of the shunt path.

5. The BAW resonator of claim 1, wherein the BAW resonator is arranged on a carrier substrate comprising Silicon.

6. The BAW resonator of claim 5, wherein the Silicon is doped Silicon.

7. The BAW resonator of claim 6, wherein the doped Silicon has a conductivity below 10-3 1/Ω cm at temperatures below 100° C. and a conductivity above 10-3 1/Ω cm at temperatures above 200° C.

8. The BAW resonator of claim 1, wherein a Silicon Oxide layer is arranged between the bottom electrode and a carrier substrate.

9. The BAW resonator of claim 8, wherein the Silicon Oxide layer has a thickness between 100 nm and 600 nm.

10. The BAW resonator of claim 1, wherein the temperature dependent conductance of the shunt path is configured to:
enable the RF signal to bypass the layer stack when the temperature of shunt path exceeds a temperature threshold; and
permit the RF signal to be input into the layer stack when the temperature of the shunt path is less than or equal to the temperature threshold.

11. The BAW resonator of claim 1, wherein the shunt path comprises a section with a doping level different from a surrounding of the section.

12. A radio frequency (RF) filter, comprising:
a bulk acoustic wave (BAW) resonator, the BAW resonator comprising:
a layer stack with a bottom electrode, a top electrode and a piezoelectric material between the bottom electrode and the top electrode; and
a shunt path, parallel to the layer stack, connecting a ground potential to at least one of the top electrode or the bottom electrode, wherein the shunt path has a temperature dependent conductance configured to enable an RF signal to bypass the layer stack or permit the RF signal to be input into the layer stack depending on a temperature of the shunt path.

13. The RF filter of claim 12, comprising an acoustic mirror below the bottom electrode, wherein the acoustic mirror establishes an element of the shunt path.

14. The RF filter of claim 12, wherein:
the BAW resonator is arranged on a carrier substrate, and the carrier substrate establishes an element of the shunt path.

15. The RF filter of claim 12, further comprising a protection element, wherein the protection element establishes an element of the shunt path.

16. The RF filter of claim 12, wherein the BAW resonator is arranged on a carrier substrate comprising Silicon.

17. The RF filter of claim 16, wherein the Silicon is doped Silicon, and the doped Silicon has a conductivity below 10-3 1/Ω cm at temperatures below 100° C. and a conductivity above 10-3 1/Ω cm at temperatures above 200° C.

18. The RF filter of claim 12, wherein the shunt path comprises a section with a doping level different from a surrounding of the section.

19. The RF filter of claim 12, wherein a Silicon Oxide layer is arranged between the bottom electrode and a carrier substrate.

20. The RF filter of claim 19, wherein the Silicon Oxide layer has a thickness between 100 nm and 600 nm.

* * * * *